(12) United States Patent
Kim et al.

(10) Patent No.: US 10,468,636 B2
(45) Date of Patent: Nov. 5, 2019

(54) METHOD AND APPARATUS FOR MANUFACTURING DISPLAY APPARATUS

(71) Applicant: Samsung Display Co., Ltd., Yongin-si, Gyeonggi-do (KR)

(72) Inventors: Byeonghyun Kim, Yongin-si (KR); Myungsoo Kyung, Yongin-si (KR); Seungjoo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/789,611

(22) Filed: Oct. 20, 2017

(65) Prior Publication Data

US 2018/0114952 A1 Apr. 26, 2018

(30) Foreign Application Priority Data

Oct. 21, 2016 (KR) .................. 10-2016-0137703

(51) Int. Cl.
  *B32B 41/00* (2006.01)
  *H01L 51/56* (2006.01)
  *G06T 7/70* (2017.01)
  *H01L 51/00* (2006.01)

(52) U.S. Cl.
  CPC .............. *H01L 51/56* (2013.01); *G06T 7/70* (2017.01); *H01L 51/0013* (2013.01)

(58) Field of Classification Search
  CPC ................................ H01L 51/56; G06T 7/70

USPC .......... 156/64, 350, 351, 368, 378, 379, 582
See application file for complete search history.

(56) References Cited

U.S. PATENT DOCUMENTS 5,413,651 A * 5/1995 Otruba ................ B26D 5/20
  156/351
2012/0090786 A1* 4/2012 Jeong ............... B32B 38/1833
  156/350

FOREIGN PATENT DOCUMENTS

| KR | 10-2013-0020298 A | 2/2013 |
|---|---|---|
| KR | 10-2013-0064851 A | 6/2013 |
| KR | 10-1376625 B1 | 4/2014 |
| KR | 10-2014-0104113 A | 8/2014 |
| KR | 10-1577268 B1 | 12/2015 |

* cited by examiner

*Primary Examiner* — Michael N Orlando
*Assistant Examiner* — Joshel Rivera
(74) *Attorney, Agent, or Firm* — Lewis Roca Rothgerber Christie LLP

(57) ABSTRACT

An apparatus for manufacturing a display apparatus includes: a support; a first stage on the support and configured to be linearly movable and to receive a film member thereon; a second stage on the support and spaced from the first stage, the second stage being configured to be linearly movable and to receive a display panel thereon; and a drum spaced from the first stage and the second stage and configured to selectively receive the film member and to transfer the film member to the display panel. The first stage, the second stage, and the drum are arranged along a first direction.

10 Claims, 11 Drawing Sheets

METHOD AND APPARATUS FOR MANUFACTURING DISPLAY APPARATUS

CROSS-REFERENCE TO RELATED APPLICATION

This application claims priority to and the benefit of Korean Patent Application No. 10-2016-0137703, filed on Oct. 21, 2016 in the Korean Intellectual Property Office, the disclosure of which is incorporated herein in its entirety by reference.

BACKGROUND

1. Field

Aspects of embodiments of the present invention relate to methods and apparatuses for manufacturing a display apparatus.

2. Description of the Related Art

Mobile electronic devices have been widely used. Recently, in addition to small electronic devices, such as mobile phones, tablet personal computers (PCs) have been extensively used as mobile electronic devices.

Such mobile electronic devices include display apparatuses to support various functions and to provide users with visual information, such as images or videos. As components for driving display apparatuses have recently decreased in size, the display apparatuses are becoming increasingly important, and a structure for bending flat display apparatuses (e.g., a structure for bending flat display apparatuses to have a certain angle) have been developed.

SUMMARY

In general, when a display apparatus is manufactured, a variety of functional film members may be attached to a display panel so as to secure a viewing angle of the display panel and/or to prevent blurring of light, damage, etc. In this case, accurate attachment of the functional film members to the display panel is important. Embodiments of the present invention include an apparatus for manufacturing a display apparatus, which accurately attaches film members to a display panel, and a method of manufacturing the display apparatus.

Additional aspects will be set forth, in part, in the description which follows and, in part, will be apparent from the description or may be learned by practice of the presented embodiments.

According to an embodiment, an apparatus for manufacturing a display apparatus includes: a support; a first stage on the support and configured to be linearly movable and to receive a film member thereon; a second stage on the support and spaced from the first stage, the second stage being configured to be linearly movable and to receive a display panel thereon; and a drum spaced from the first stage and the second stage and configured to selectively receive the film member and to transfer the film member to the display panel. The first stage, the second stage, and the drum are arranged along a first direction.

The apparatus may further include a linear driver between the support and at least one of the first stage and the second stage, and the linear driver may be configured to reciprocate the at least one of the first stage and the second stage in the first direction.

The first stage may include: a first table configured to receive the film member thereon; and a first table aligning portion configured to rotate the first table and/or to move the first table in a second direction different from the first direction.

The second stage may include: a second table configured to receive the display panel thereon; and a second table aligning portion configured to rotate the second table and/or to move the second table in a second direction different from the first direction.

The apparatus may further include a vision portion configured to detect a location of the film member and/or a location of the display panel.

The drum may include: a core configured to rotate; and a detachable sheet on an outer surface of the core and configured to selectively receive the film member.

The detachable sheet may be on a portion (or on only a portion) of the outer surface of the core.

The drum may include: a core configured to rotate; and an outer skin portion on an outer surface of the core and having a suction opening therein to selectively attach the film member thereto.

An outer surface of the outer skin portion may be uneven.

The apparatus may further include a protection member remover spaced from the drum and configured to remove a protection member from the film member.

According to another embodiment, a method of manufacturing a display apparatus includes: arranging a film member on a first stage and arranging a display panel on a second stage, the first stage being spaced from and at the same level as the second stage; linearly moving the first stage to correspond to a drum such that the film member moves from the first stage to the drum while the first stage linearly moves and the drum rotates; and linearly moving the second stage to correspond to the film member on the drum such that the film member moves from the drum to the display panel while the second stage linearly moves and the drum rotates.

The method may further include detecting a location of the film member on the first stage by using a vision portion.

The method may further include comparing a reference location with the detected location of the film member and adjusting the location of the film member to correspond to the reference location.

The method may further include detecting a location of the display panel on the second stage by using a vision portion.

The method may further include comparing a reference location with the detected location of the display panel and adjusting the location of the display panel to correspond to the reference location.

When the film member is attached to the drum, a movement velocity of the first stage may be synchronized with a rotation velocity of the drum.

When the film member is attached to the display panel, a movement velocity of the second stage may be synchronized with a rotation velocity of the drum.

The method may further include removing a protection member from the film member.

These exemplary embodiments may be implemented by using a system, a method, a computer program, or a combination thereof.

BRIEF DESCRIPTION OF THE DRAWINGS

These and/or other aspects will become apparent and more readily appreciated from the following description of exemplary embodiments, taken in conjunction with the accompanying drawings, in which.

DETAILED DESCRIPTION

Figure 1:
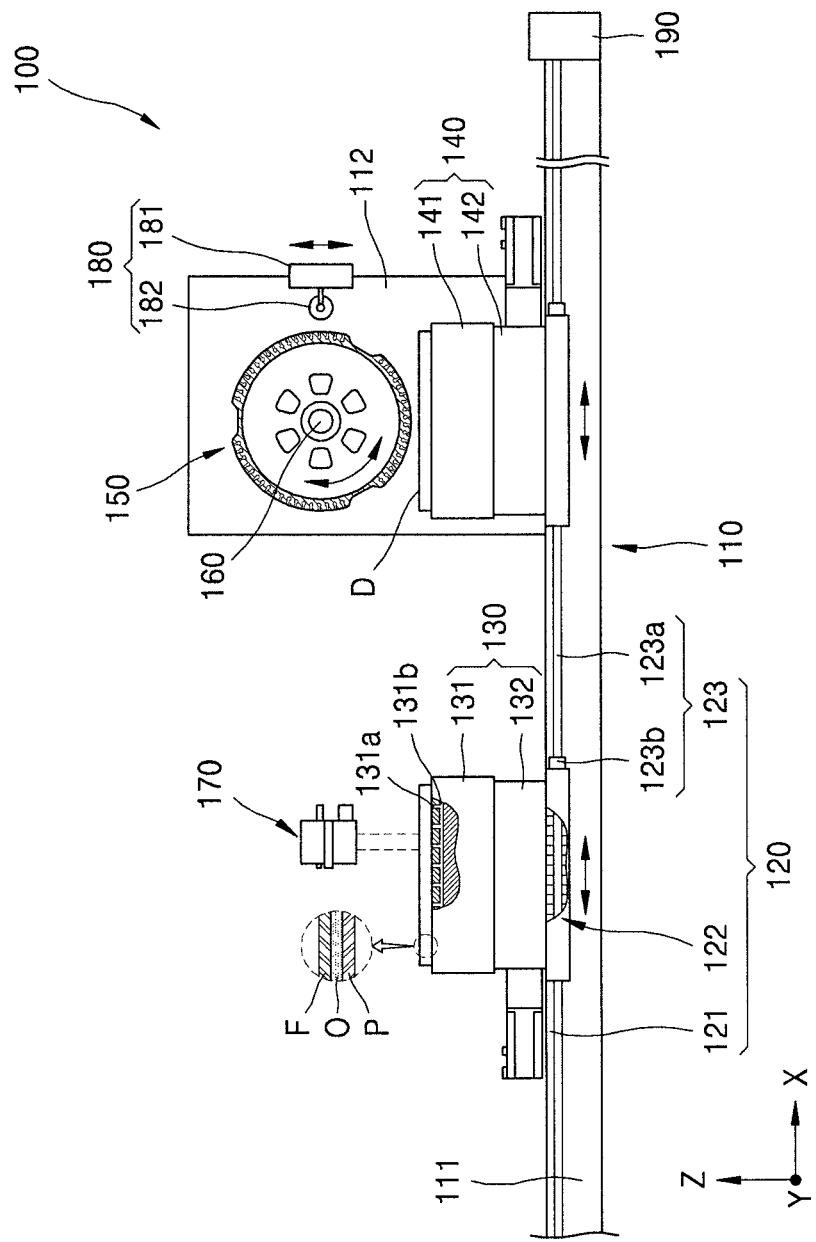
FIG. 1 is a front view of an apparatus for manufacturing a display apparatus according to an embodiment.

Reference will now be made in detail to embodiments, examples of which are illustrated in the accompanying drawings, in which like reference numerals refer to like elements throughout. The present invention may have different forms and should not be construed as being limited to the exemplary embodiments set forth herein. Accordingly, exemplary embodiments are merely described below, by referring to the figures, to explain aspects of the present invention. As used herein, the term "and/or" includes any and all combinations of one or more of the associated listed items. Expressions, such as "at least one of," when preceding a list of elements, modify the entire list of elements and do not modify the individual elements of the list. Further, the use of "may" when describing embodiments of the present invention relates to "one or more embodiments of the present invention." Also, the term "exemplary" is intended to refer to an example or illustration. As used herein, the terms "use," "using," and "used" may be considered synonymous with the terms "utilize," "utilizing," and "utilized," respectively.

As the present disclosure allows for various changes and numerous embodiments, particular exemplary embodiments will be illustrated in the drawings and described, in detail, in the written description. The present invention may, however, be embodied in many different forms and should not be construed as being limited to the exemplary embodiments set forth herein.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

It will be understood that although the terms "first", "second", etc. may be used herein to describe various components, these components should not be limited by these terms. These terms are used to distinguish one component from another. Further, spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the singular forms "a," "an," and "the" are intended to include the plural forms as well, unless the context clearly indicates otherwise.

It will be further understood that the terms "includes," "including," "comprises," and/or "comprising" used herein specify the presence of stated features or components but do not preclude the presence or addition of one or more other features or components.

Sizes of components in the drawings may be exaggerated for convenience of explanation. Because sizes and thicknesses of components in the drawings may be arbitrarily illustrated for convenience of explanation, the following embodiments and the present invention are not limited thereto.

In the following description, the x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed at substantially the same time or performed in an order opposite to the described order.

The controller and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the controller may be formed on one integrated circuit (IC) chip or on separate IC chips. Further, the various components of the controller may be implemented on a flexible printed circuit film, a tape carrier package (TCP), a printed circuit board (PCB), or formed on a same substrate as the controller. Further, the various components of the controller may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

FIG. 1 is a front view of an apparatus 100 for manufacturing a display apparatus according to an embodiment.

Referring to FIG. 1, the apparatus 100 may include a support 110, a linear driver 120, a first stage 130, a second stage 140, a drum 150, a vision portion 170, and a protection member remover 180.

The support 110 may be fixed to or disposed on an external component. For example, the support 110 may be on a separate device, the ground, or a wall of a building. Hereinafter, for convenience of explanation, the support 110 is shown as being on the ground (or on the floor of a building).

The support 110 may include a first support 111 parallel to the ground and a second support 112 connected to the first support 111. In some embodiments, the linear driver 120 may be installed in (or on) the first support 111, and the first stage 130 and the second stage 140 may be on the linear driver 120. The second support 112 may form an angle (e.g., a certain angle) with the first support 111 and may be connected to the first support 111. In some embodiments, the drum 150 may be installed above the second support 112.

The linear driver 120 may connect the first stage 130 and the second stage 140 to the first support 111. In some embodiments, the linear driver 120 may linearly move at least one of the first stage 130 and the second stage 140, and portions of the linear driver 120 may come into contact with (or may be connected to) the first stage 130 and the second stage 140, respectively.

The linear driver 120 may have various suitable forms. For example, the linear driver 120 may include a linear motor. In another embodiment, the linear driver 120 may include a movable block connected to the first stage 130 or the second stage 140, a ball screw connected to the movable block, and a motor connected to the ball screw to rotate the same. In another embodiment, the linear driver 120 may include a cylinder connected to the first stage 130 or the second stage 140. However, the linear driver 120 is not limited to these examples and may include any suitable structure and device that may linearly move at least one of the first stage 130 and the second stage 140 in a lengthwise direction of the first support 111. Hereinafter, for convenience of explanation, the linear driver 120 includes the linear motor.

The linear driver 120 may separately move (e.g., may independently move) the first stage 130 and the second stage 140. In such embodiments, the linear driver 120 may be connected to both the first stage 130 and the second stage 140. In other embodiments, a plurality of linear drivers 120 may be respectively connected to the first stage 130 and the second stage 140. Hereinafter, for convenience of explanation, the linear driver 120 shown in FIG. 1 is shown and described as being connected to both the first stage 130 and the second stage 140 to separately (or independently) move the same.

The linear driver 120 may include a linear guide 121 installed in a lengthwise direction of the first support 111, moving force generating portions 122 (e.g., movers or drivers) installed on the linear guide 121, and a scaling portion 123 aligned in the same direction as the linear guide 121. In some embodiments, the linear guide 121 may include a linear motion guide. The first stage 130 and the second stage 140 may be on the linear guide 121 and, thus, may linearly move. The moving force generating portions 122 may be respectively on the first support 111 and the first stage 130 or on the first support 111 and the second stage 140. In some embodiments, one of the moving force generating portions 122 may be a permanent magnet and another one of the moving force generating portions 122 may be an electromagnet. When the moving force generating portions 122 are the permanent magnets or electromagnets, they may be aligned in a lengthwise direction of the linear guide 121. In such embodiments, another one of the moving force generating portions 122 may be under the first stage 130 or the second stage 140. According to the operation of the electromagnets, the first stage 130 and the second stage 140 may independently move. The scaling portion 123 may be connected in the lengthwise direction of the linear guide 121. The scaling portion 123 may detect locations of the first stage 130 and the second stage 140. The scaling portion 123 may have various suitable forms. For example, the scaling portion 123 may include a linear scale 123a and a linear encoder 123b. In other embodiments, the scaling portion 123 may include an optical linear scale. However, the scaling portion 123 is not limited thereto and may include all suitable devices and structures for detecting the locations of the first stage 130 and the second stage 140.

The first stage 130 and the second stage 140 may be respectively connected to the linear driver 120 and may independently and linearly move. In such embodiments, the first stage 130 and the second stage 140 may be aligned in the same direction with respect to a rotation axis of the drum 150. Also, the first stage 130 and the second stage 140 may reciprocate at the same level. Because the first stage 130 and the second stage 140 may be identical or substantially similar, only the first stage 130 may be hereinafter described, in detail, for convenience of explanation.

The first stage 130 may include a first table 131, above which a film member F is disposed, and a first table aligning portion 132 connected to the first table 131. In some embodiments, the first table 131 may include various devices for fixing the film member F thereto. For example, an adhesive chuck or an electrostatic chuck may be on a surface of the first table 131. In other embodiments, a first opening 131a (e.g., a first through hole) is formed in the first table 131, and a first flow path 131b connected to (or in communication with) the first opening 131a is formed in the first table 131. The film member F may be fixed to the first table 131 by absorbing air within the first flow path 131b (e.g., the film member F may be vacuum-adhered to first table 131). Hereinafter, for convenience of explanation, an embodiment in which the first opening 131a and the first flow path 131b are formed in the first table 131 will be described in detail. The first table aligning portion 132 may move the first table 131 in at least one of a first direction and a second direction and may rotate the first table 131. In some embodiments, the first table aligning portion 132 may be a UVW stage and may be connected to the first table 131.

The film member F may be selectively attached to (e.g., releasably attached to) the drum 150, and the drum 150 may transfer the film member F to a display panel D. In some embodiments, the drum 150 may be rotatably disposed above the second support 112. For example, the drum 150 may be connected to a drum driver 160 and may rotate according to the operation of the drum driver 160. The drum driver 160 may include a motor.

The vision portion 170 may be spaced from (e.g., spaced apart from) the first stage 130 and the second stage 140. In some embodiments, the vision portion 170 may include a camera for capturing images of the film member F and the display panel D.

The protection member remover 180 may be close to the drum 150. In some embodiments, the protection member remover 180 may be connected to the second support 112 and may remove a protection member P attached to the film member F.

The protection member remover 180 may include a moving portion 181 that may linearly move and a protection member removal unit 182 (e.g., a protection member remover) connected to the moving portion 181 and to be attached to the protection member P. In some embodiments, the protection member removal unit 182 may be a roller. Also, the protection member removal unit 182 may include a detachable sheet so as to be attached to the protection member P. However, the protection member removal unit 182 is not limited thereto and may include all suitable devices that are connected to the moving portion 181 and that may remove the protection member P.

Figure 2:
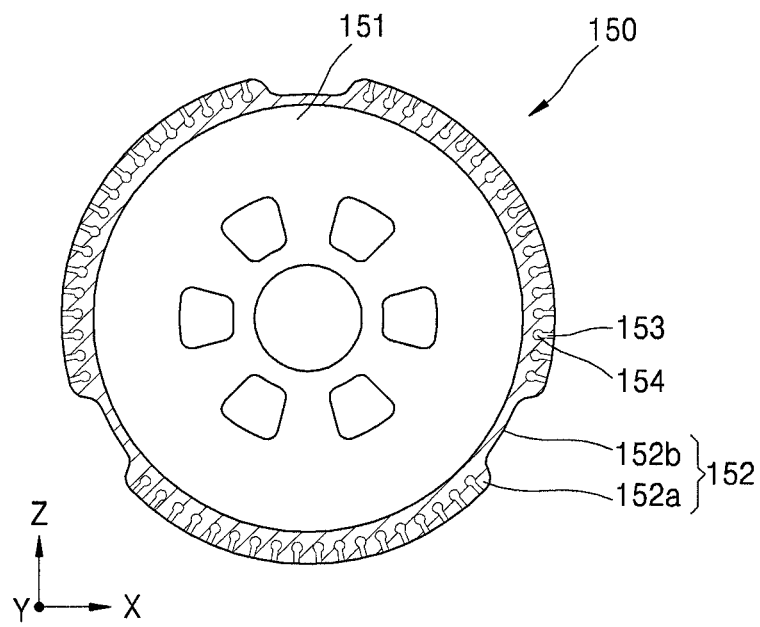
FIG. 2 is a cross-sectional view of a drum of the apparatus for manufacturing a display apparatus shown in FIG. 1 according to an embodiment.

FIG. 2 is a cross-sectional view of the drum 150 of the apparatus 100 shown in FIG. 1 according to an embodiment.

Referring to FIG. 2, the drum 150 may include a core 151 and an outer skin portion 152.

The core 151 may have a cylindrical shape. In some embodiments, the core 151 may include a hard material, such as a metal.

The outer skin portion 152 may surround an outer surface of the core 151. In some embodiments, the outer skin portion 152 may include an elastic material, such as urethane. A suction opening 153 (e.g., a suction hole) may be formed in a surface of the outer skin portion 152. In some embodiments, a plurality of suction openings 153 may be formed in the surface of the outer skin portion 152, and the suction openings 153 may be spaced from (e.g., spaced apart from or separated from) each other. Also, a suction flow path 154 connected to (or in communication with) the suction openings 153 may be formed in an inner surface of the outer skin portion 152. The suction flow path 154 may extend in a lengthwise direction of the core 151 (e.g., may extend parallel to a rotation axis of the core 151). In some embodiments, a plurality of suction flow paths 154 may be in the inner surface of the outer skin portion 152 and spaced from (e.g., spaced apart from or separate from) each other. In such embodiments, each of the suction flow paths 154 may be connected to one of the suction openings 153 arranged in the lengthwise direction of the core 151. For example, the suction openings 153 connected to (or in communication with) one of the suction flow paths 154 may be arranged in a line that is parallel to the lengthwise direction of the core 151. The suction flow path(s) 154 may be connected to an external suction pump (e.g., an external vacuum pump), and according to the operation of the suction pump, the suction flow path 154 may guide internal air toward the suction pump.

The surface of the outer skin portion 152 may be uneven. For example, the outer skin portion 152 may include protrusions 152a protruding from the surface of the outer skin portion 152 and inlet portions 152b (e.g., grooves) that are concave towards the core 151. In some embodiments, the suction openings 153 may be in the protrusions 152a and, thus, may fix the film member F to the outer skin portion 152.

The protrusions 152a and the inlet portions 152b may be alternately arranged. Also, the protrusions 152a may be arranged at the same or substantially the same angles with respect to a center of the core 151 (e.g., may be arranged equidistant from each other about the rotation axis of the core 151).

Figure 3:
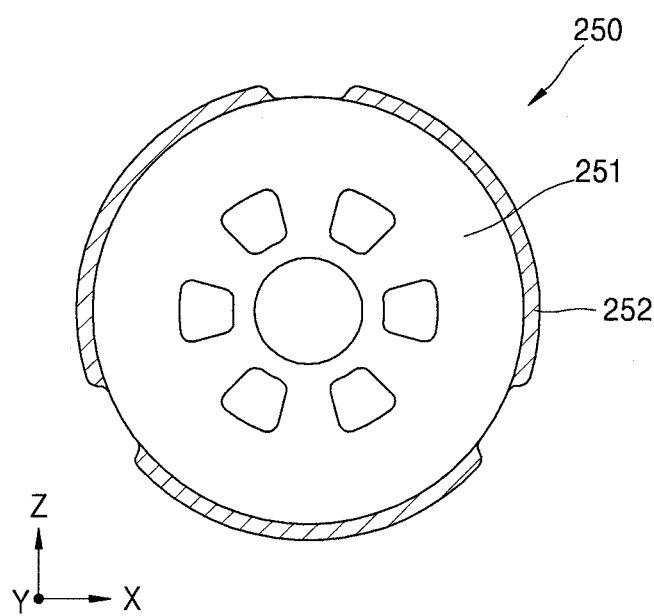
FIG. 3 is a cross-sectional view of a drum of the apparatus for manufacturing a display apparatus shown in FIG. 1 according to another embodiment.

FIG. 3 is a cross-sectional view of a drum 250 of the apparatus 100 shown in FIG. 1 according to another embodiment.

Referring to FIG. 3, the drum 250 may include a core 251 and a detachable sheet 252. The core 251 may include a hard material, such as a metal. The detachable sheet 252 may be on an outer surface of the core 251. There may be a plurality of detachable sheets 252 on the outer surface of the core 251, and the detachable sheets 252 may be spaced from (e.g., spaced apart from or separate from) each other on the outer surface of the core 251. In some embodiments, a pad, a terminal, etc. of the display panel D may be arranged to be adjacent to the detachable sheets 252 when the display panel D is under the core 251.

The film member F may be attached to the detachable sheet 252 and may then be transferred to the display panel D.

Hereinafter, a method of operating the apparatus 100 will be described, in detail, based on an embodiment in which the drum 150 is formed as shown in FIG. 2.

Figure 4:
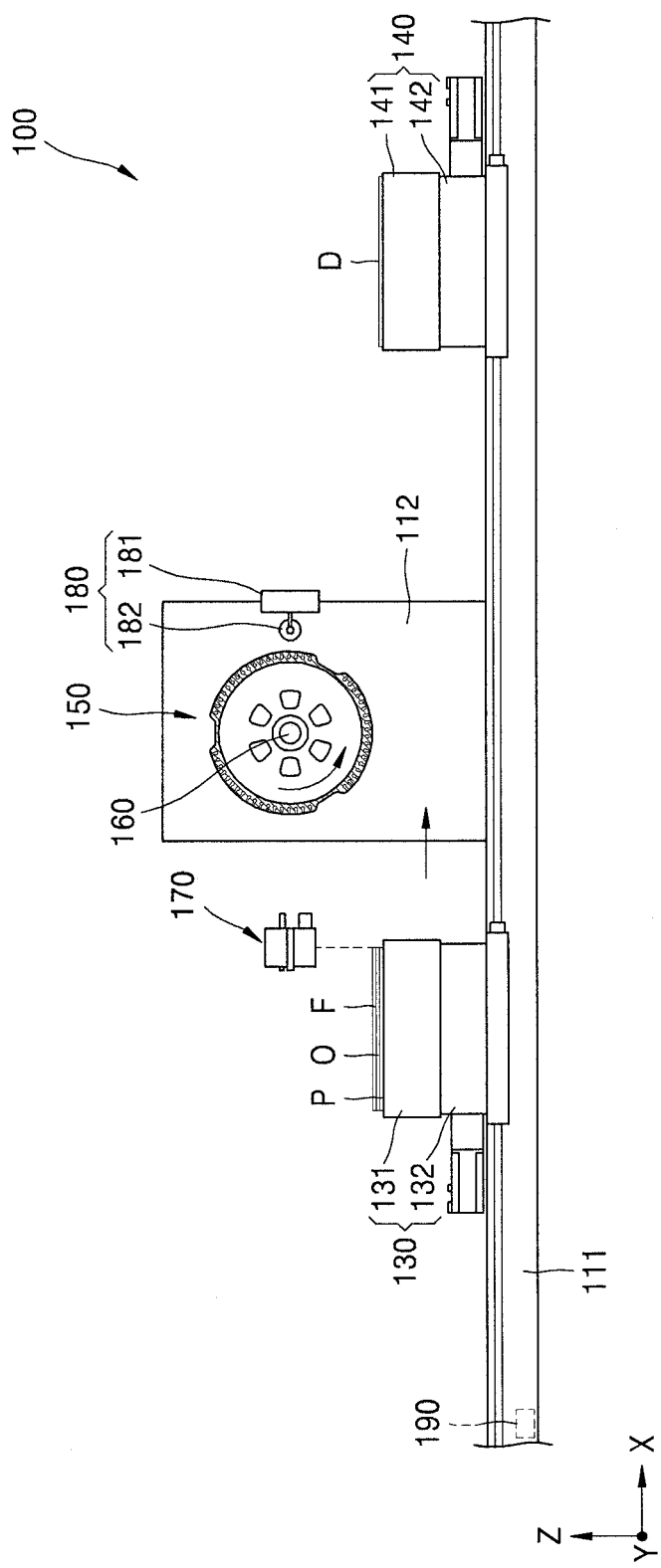
FIG. 4 is an operation diagram showing an operation order of the apparatus for manufacturing a display apparatus shown in FIG. 1.
Figure 5:
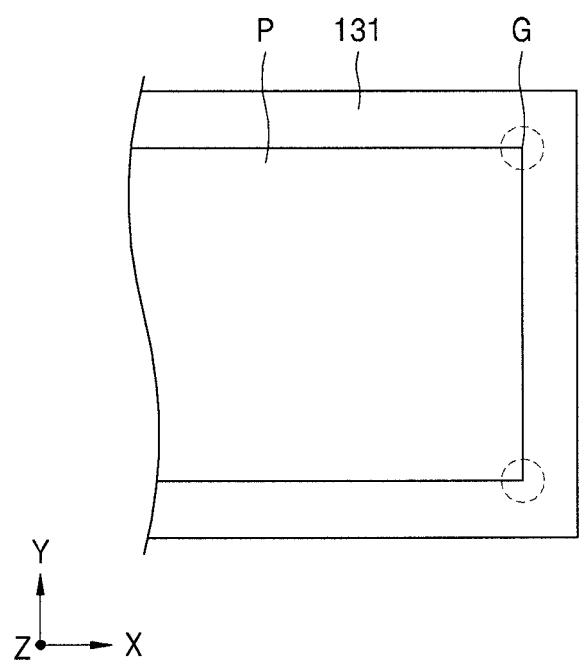
FIG. 5 is a plan view of a protection member and a first table shown in FIG. 4.

FIG. 4 is an operation diagram showing an operation order of the apparatus 100 shown in FIG. 1, and FIG. 5 is a plan view of the protection member P and the first table 131 shown in FIG. 4.

Referring to FIGS. 4 and 5, when the apparatus 100 operates, the film member F and the display panel D are provided from the outside and may then be arranged on the first table 131 and a second table 141, respectively. In some embodiments, the protection member P is on the first table 131, and an adhesive member O may be on the protection member P. The film member F may be on the adhesive member O. The adhesive member O may include a transparent material (e.g., a transparent film) and may be attached to the film member F. Also, the protection member P may be temporarily attached (e.g., may be releasably attached) to the adhesive member O to protect the adhesive member O and the film member F. The protection member P may be release paper or the like.

The protection member P may be fixed to the first table 131 through the first opening 131a (e.g., the first through hole) and the first flow path 131b in the first table 131. Also, the display panel D may be fixed to the second table 141 through a second opening and a second flow path in the second table 141.

When the protection member P and the display panel D are fixed to the first stage 130 and the second stage 140, respectively, the first stage 130 may move by operating the linear driver 120 such that the film member F corresponds to the vision portion 170.

When the first table 131 corresponds to (e.g., is aligned with) the vision portion 170, the vision portion 170 may photograph an edge G of the film member F.

An image captured by the vision portion 170 may be transmitted to a controller 190. The controller 190 may have various suitable forms. For example, the controller 190 may include a circuit board installed in the support 110 or the like. In other embodiments, the controller 190 may include a personal computer (PC), a laptop, etc. installed in the support 110, etc. In other embodiments, the controller 190 may include a computer, a mobile phone, a portable terminal, a server, etc. that are connected from outside to the apparatus 100 to communicate with the apparatus 100. Hereinafter, an embodiment in which the controller 190 includes the circuit board installed in the support 110 will be described in detail.

The controller 190 may compare an alignment location (e.g., a preset or predetermined location) with a location of the film member F that is detected by the vision portion 170. For example, when the location of the film member F is compared with the alignment location, based on a location of the edge G of the film member F, the controller 190 may determine a misalignment degree of the location of the film member F and a corresponding degree of movement in the first direction and the second direction to correct the misalignment.

When the location of the film member F is aligned with or substantially aligned with the alignment location, the controller 190 may proceed with a next process. When the location of the film member F is different from (e.g., is offset from or not aligned with) the alignment location, the controller 190 may accurately adjust a location of the first table 131 by operating the first table aligning portion 132. In such a case, the controller 190 may operate the first table aligning portion 132 in such a manner that the film member F is moved to be aligned with or substantially aligned with the alignment location. According to the operation of the first table aligning portion 132, the first table 131 may move in the first direction (e.g., one of an X direction or a Y direction in FIGS. 4 and 5), the second direction (e.g., the other of the X direction or the Y direction in FIGS. 4 and 5), and/or may rotate about a third direction (e.g., a Z direction in FIGS. 4 and 5). According to the movement of the first table 131, the film member F may be aligned with or substantially aligned with the alignment location and, thus, may be aligned. The movement and rotation may be repeated until the film member F is suitably aligned.

When the film member F is aligned, the linear driver 120 operates to move the first stage 130 in the lengthwise direction of the first support 111. For example, according to the operation of the linear driver 120, the first stage 130 may move in a +X direction in FIG. 4 (e.g., a rightward direction in FIG. 4).

According to the movement of the first stage 130, the drum 150 may rotate. A rotation velocity of the drum 150 may be synchronized with or substantially synchronized with a movement velocity of the first stage 130. For example, the controller 190 may adjust the drum driver 160 such that the rotation velocity of the drum 150 (e.g., an angular velocity of the drum 150) corresponds to the movement velocity of the first stage 130.

When the first stage 130 is moved as described above, the first stage 130 may accelerate in an acceleration section, and when the first stage 130 passes (or exits) the acceleration section, the first stage 130 may move within a uniform velocity range. For example, when the film member F reaches a location that is near to (e.g., near to but not under) the drum 150, the first stage 130 may move at a uniform velocity to a location where the first stage 130 contacts the drum 150. The first stage 130 may move within the uniform velocity range including a target velocity. In some embodiments, the drum 150 may rotate at different speeds, such as when drum 150 accelerates and when the drum 150 rotates at uniform velocity. The controller 190 may control the linear driver 120 and the drum driver 160 in such a manner that the first stage 130 and the drum 150 move as described above.

As the first stage 130 linearly moves and the drum 150 rotate, the film member F may contact the outer skin portion 152 and may be attached thereto. For example, air existing within the suction opening 153 and in the suction flow path 154 of the outer skin portion 152 is absorbed from the outside, and thus, internal pressure in the suction opening 153 and in the suction flow path 154 may be a vacuum. In this case, the film member F may be fixed to the outer skin portion 152.

Figure 6:
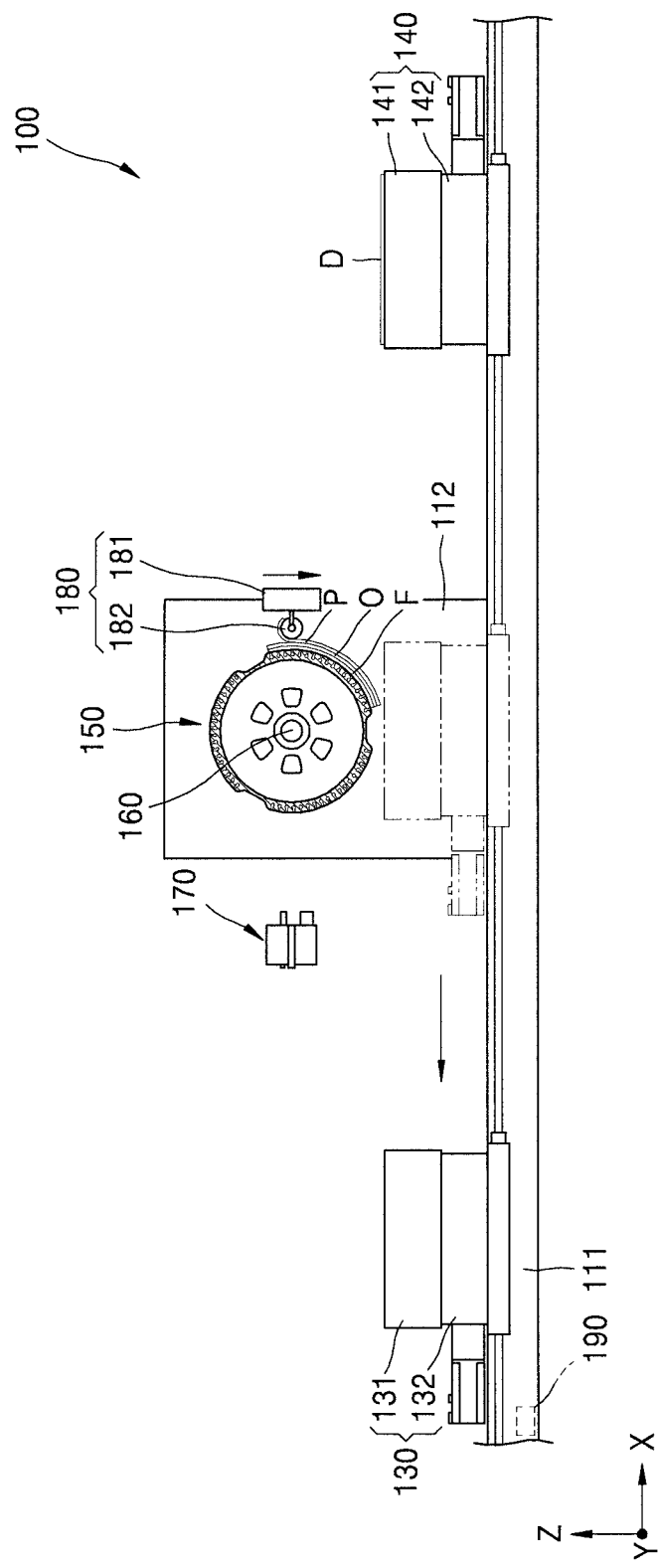
FIG. 6 is an operation diagram showing an operation order of the apparatus for manufacturing a display apparatus shown in FIG. 1.

FIG. 6 is an operation diagram showing an operation order of the apparatus 100 shown in FIG. 1.

Referring to FIG. 6, after the film member F is attached to the drum 150, the first stage 130 may return to its original location (e.g., a loading location). Also, the protection member remover 180 may operate to remove the protection member P (e.g., to remove the protection member P from the adhesive member O). For example, the controller 190 may operate the moving portion 181 such that the protection member removal unit 182 may contact the protection member P. In some embodiments, the moving portion 181 may move in a Y direction in FIG. 6 in such a manner that a location of the protection member removal unit 182 corresponds to that of the protection member P, and thus, a portion of the protection member P may be attached to the protection member removal unit 182. Then, the controller 190 may move the protection member removal unit 182 in a −Z direction in FIG. 6 (e.g., a downward direction in FIG. 6) by moving the moving portion 181 in the −Z direction and, thus, may separate the protection member P from the adhesive member O. Thus, the protection member P may be detached from the adhesive member O.

However, the operation of the protection member remover 180 is not limited thereto, and the protection member P may be removed from the adhesive member O in various suitable manners.

Figure 7:
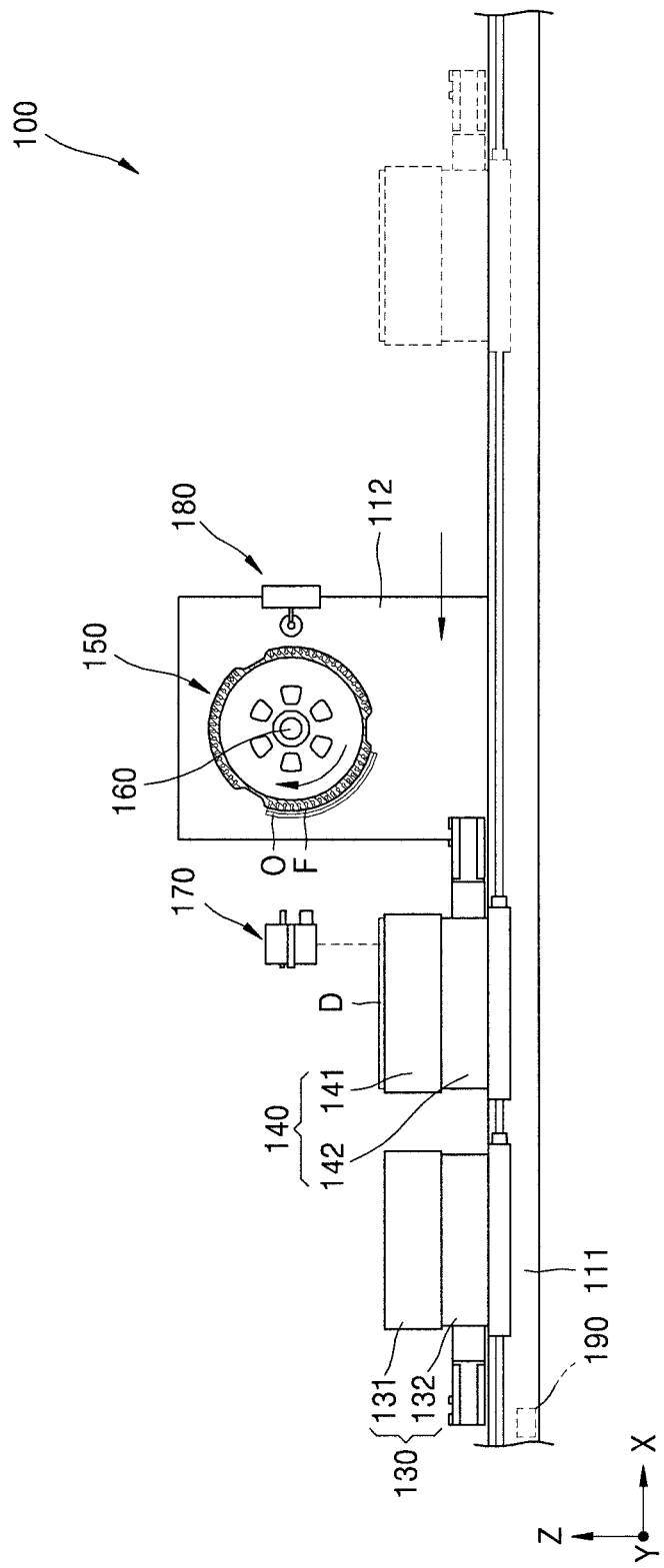
FIG. 7 is an operation diagram showing an operation order of the apparatus for manufacturing a display apparatus shown FIG. 1.
Figure 8:
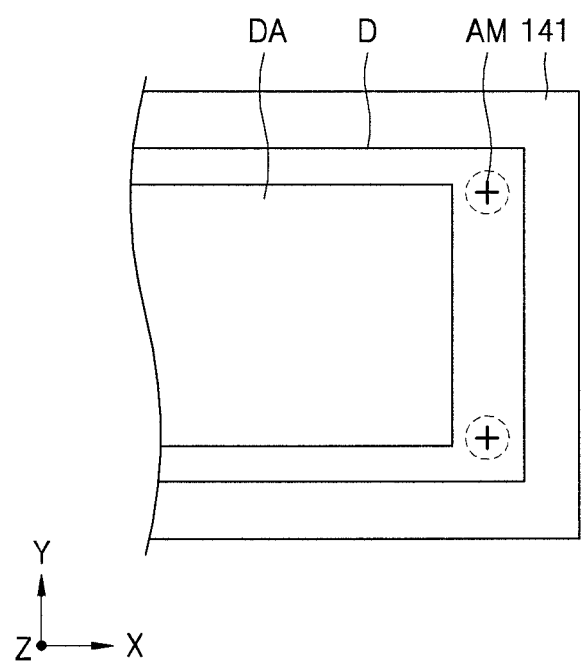
FIG. 8 is a plan view of a display panel and a second table shown in FIG. 7.

FIG. 7 is an operation diagram showing an operation order of the apparatus 100 shown in FIG. 1, and FIG. 8 is a plan view of the display panel D and the second table 141 shown in FIG. 7.

Referring to FIGS. 7 and 8, after the protection member P is removed, the second stage 140 may linearly move to a location corresponding to the vision portion 170. For example, the second stage 140 may move in a −X direction (e.g., a leftward direction in FIG. 7), and thus, the display panel D may be at a location corresponding to the vision portion 170.

In this embodiment, a separate elevation driver may be disposed between the second table 141 and the second table aligning portion 142 or between the second table aligning portion 142 and the linear driver 120. The second table 141 or the second stage 140 may move upwards and downwards in a Z direction (e.g., in +Z and −Z directions, respectively). In another embodiment, the second table aligning portion 142 may move the second table 141 upwards and downwards in the Z direction. Hereinafter, for convenience of explanation, an embodiment in which the second table aligning portion 142 moves the second table 141 upwards and downwards in the Z direction will be described in more detail.

In the above-described embodiment, when the second stage 140 passes a lower side surface of the drum 150, the second table aligning portion 142 moves the second table 141 in a −Z direction, and thus, contact between the film member F and the display panel D may be prevented. In this case, when the second table 141 is disposed on a lower side of the vision portion 170, the second table aligning portion 142 may move the second table 141 upwards in the +Z direction to an original location of the second table 141. In another embodiment, the second table aligning portion 142 may move the second table 141 upwards in the +Z direction before the vision portion 170 photographs a portion of the display panel D, and then, the second table 141 is moved towards the drum 150 as further described below. Hereinafter, for convenience of explanation, an embodiment in which the second table aligning portion 142 moves the second table 141 upwards in the +Z direction when the second table 141 passes the drum 150 and is then disposed on a lower surface of (or below) the vision portion 170 will be described in more detail.

The vision portion 170 may photograph a portion of the display panel D. In some embodiments, the vision portion 170 may photograph an alignment mark AM on the display panel D. Images captured by the vision portion 170 may be transmitted to the controller 190, and the controller 190 may calculate a location of the display panel D based on the images captured by the vision portion 170.

The controller 190 may compare the location of the display panel D that is detected by the vision portion 170 with a reference location. When the location of the display panel D is determined to be identical to or substantially the same as the reference location, the controller 190 may proceed with a process of transferring the film member F to the display panel D, which will be further described later. When the location of the display panel D is determined to be different from the reference location, the controller 190 may control a second table aligning portion 142 to adjust the location of the display panel D to correspond to the reference location. For example, the controller 190 may compare the alignment mark AM with the reference location in order to calculate a distance of the display panel D from the reference location, a misalignment degree of the display panel D, or the like. Based on the calculated distance, misalignment degree, etc., the controller 190 may change the location of the display panel D by operating the second table aligning portion 142. In some embodiments, the vision portion 170 may keep monitoring the alignment mark AM, and the controller 190 may keep performing the above process based on a monitoring result of the vision portion 170 so as to align the display panel D.

Before or while the display panel D is aligned, the drum 150 may rotate in a direction (e.g., one of a clockwise direction and a counterclockwise direction) that is opposite to a direction (e.g., the other of the clockwise direction and the counterclockwise direction) in which the drum 150 rotates as the film member F was attached thereto. At this time, the film member F may be close to the second stage 140.

In one or more embodiments of the present invention, the process of aligning the display panel D is performed after the film member F is attached to the drum 150, but the present invention is not limited thereto. For example, in one or more embodiments of the present invention, the process of aligning the display panel D and the process of aligning the film member F may be concurrently (or simultaneously) performed. For example, when the film member F is aligned, the second stage 140 may linearly move to be close to the first stage 130, and after the film member F is aligned, the vision portion 170 may photograph the display panel D and the display panel D may be aligned. In some embodiments, after the film member F and the display panel D are aligned, the second stage 140 may return to its original location (e.g., a loading location). Also, after the film member F is attached to the drum 150, the drum 150 may rotate as described above, and thus, the film member F and the display panel D may be aligned as shown in FIG. 7. Then, a process of transferring the film member F to the display panel D may be performed. Hereinafter, for convenience of explanation, an embodiment in which the display panel D is aligned after the film member F is attached to the drum 150 will be described in detail.

Figure 9:
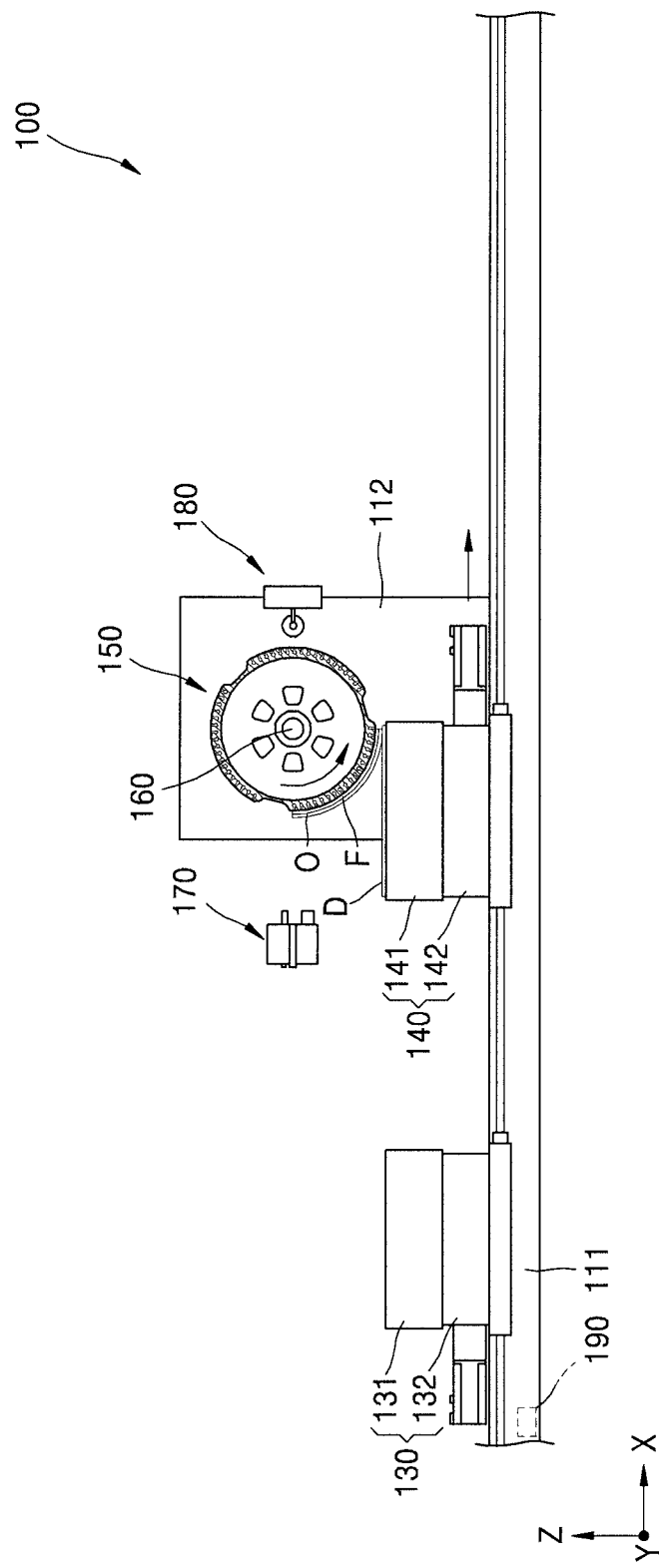
FIG. 9 is an operation diagram showing an operation order of the apparatus for manufacturing a display apparatus shown in FIG. 1.

FIG. 9 is an operation diagram showing an operation order of the apparatus 100 shown in FIG. 1.

Referring to FIG. 9, after the display panel D is aligned, the second stage 140 moves while the drum 150 rotates, and the film member F may be transferred to the display panel D. For example, when the second stage 140 is at a location corresponding to the drum 150, the drum 150 and the second stage 140 accelerate to reach a certain velocity range, and the film member F and the display panel D may contact each other. In some embodiments, the rotation velocity of the drum 150 may be synchronized or substantially synchronized with the movement velocity of the second stage 140. Also, the drum 150 may rotate in a counterclockwise direction, and the second stage 140 may move in a +X direction. The film member F is attached to the display panel D by the adhesive member O.

For example, when the second stage 140 enters a uniform velocity section as described above, the movement velocity of the second stage 140 may be within a uniform velocity range. If the movement velocity of the second stage 140 exceeds the uniform velocity range, the film member F may be wrinkled or bubbled, etc. when it is transferred to the display panel D. Also, if the rotation velocity of the drum 150 does not reach the certain velocity range due to, for example, low acceleration of the drum 150 before the film member F and the display panel D contact each other, the above-described problems may occur.

During the above process, the internal pressure in the suction opening 153 may be maintained to be identical or similar to normal pressure (e.g., a vacuum in the suction opening 153 may be released) by injecting air into the suction opening 153 and into the suction flow path 154. In some embodiments, some of the suction openings 153 arranged at a location where the film member F and the display panel D contact each other may have an internal pressure that is identical or similar to the normal pressure. The suction openings 153 may sequentially have an internal pressure that is identical or similar to the normal pressure in a direction opposite to a rotation direction of the drum 150. For example, the suction openings 153 may have an internal pressure that is identical or similar to the normal pressure, sequentially from the suction opening 153 at a location where the film member F first contacts the display panel D to the suction opening 153 at a location where the film member F last contacts the display panel D (e.g., the vacuum in the suction openings 153 may be sequentially released from the suction openings 153 that contact one edge of the film member F that first contacts to the display panel D to the suction openings 153 that contact an opposite edge of the film member F).

Figure 10:
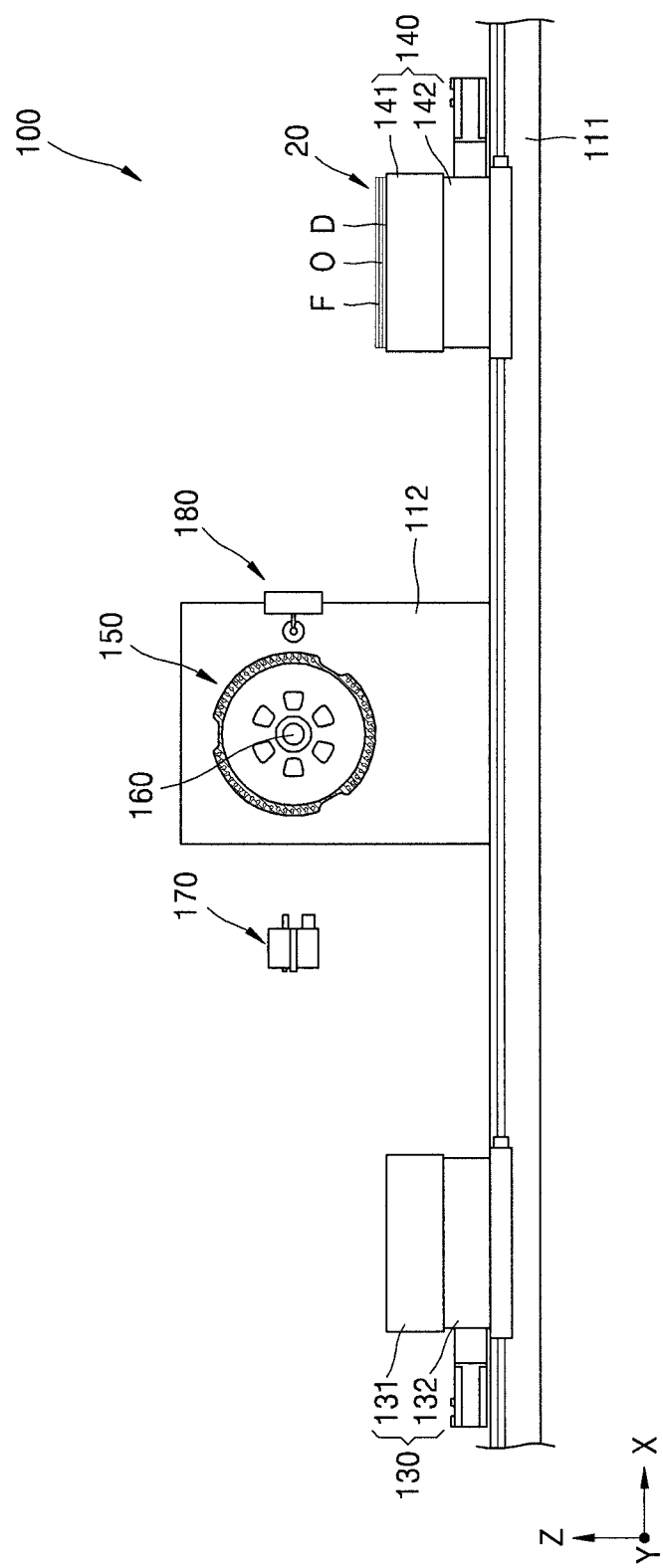
FIG. 10 is an operation diagram showing an operation order of the apparatus for manufacturing a display apparatus shown in FIG. 1.

FIG. 10 is an operation diagram showing an operation order of the apparatus 100 shown in FIG. 1.

Referring to FIG. 10, a display apparatus 20 may be manufactured when the film member F is transferred to the display panel D. The film member F may be attached to a portion (e.g., may be attached to only a portion) of a surface of the display panel D. Also, the second stage 140 may return to its original location, and the display apparatus 20 may be discharged to the outside from the second stage 140 by an external robot arm, a shuttle, or the like.

Therefore, in the apparatus 100 and a method of manufacturing the display apparatus 20 according to embodiments, the film member F may be accurately attached to the display panel D. In addition, a failure rate during the manufacture of the display apparatus 20 may be decreased. In the apparatus 100 and a method of manufacturing the display apparatus 20, the display apparatus 20 may be more simply manufactured.

Figure 11:
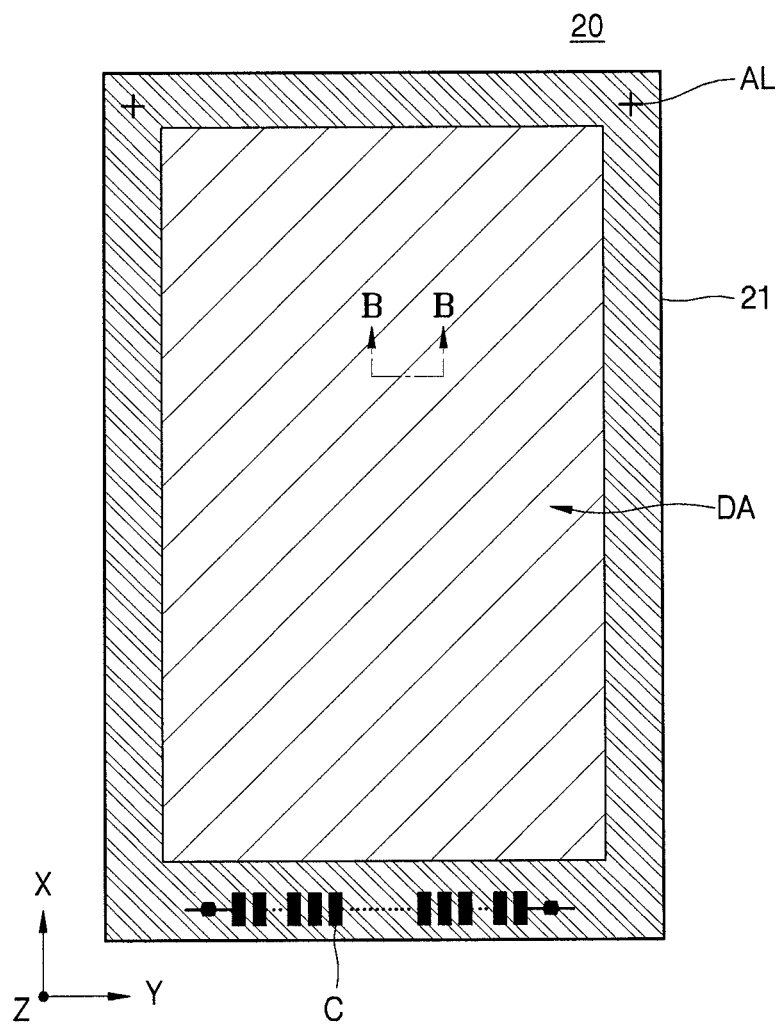
FIG. 11 is a plan view of a display apparatus manufactured by the apparatus for manufacturing a display apparatus shown in FIG. 1.
Figure 12:
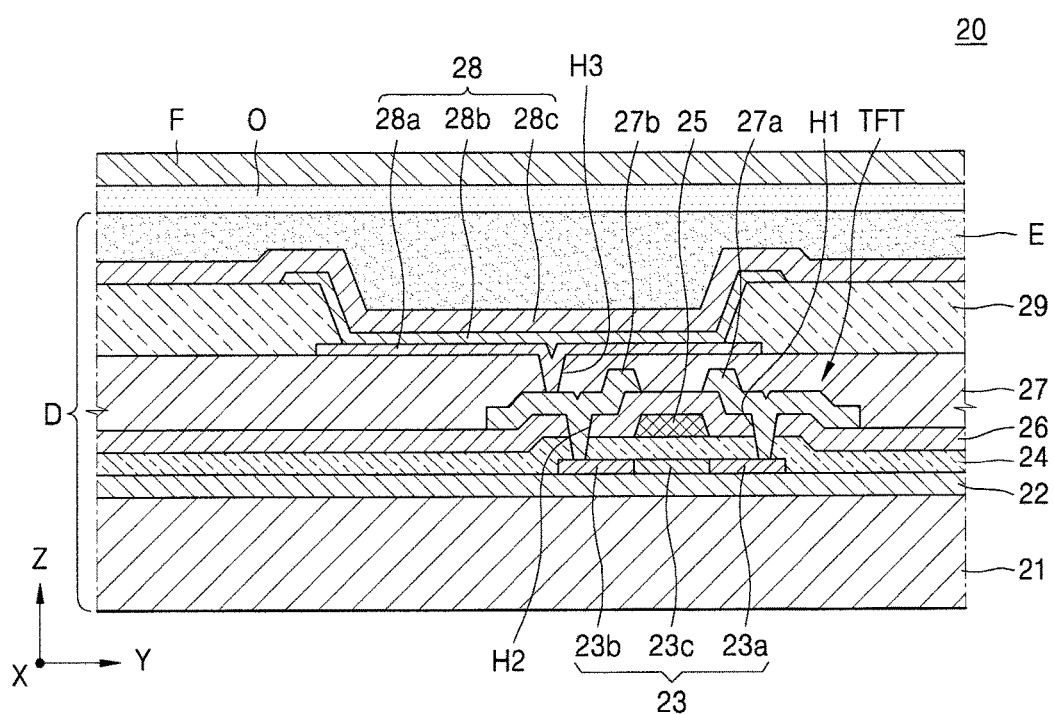
FIG. 12 is a cross-sectional view taken along the line B-B of FIG. 11.

FIG. 11 is a plan view of the display apparatus 20 manufactured by the apparatus 100 shown in FIG. 1, and FIG. 12 is a cross-sectional view taken along the line B-B of FIG. 11.

Referring to FIGS. 11 and 12, in the display apparatus 20, a display area DA may be defined on a substrate 21, and a non-display area may be defined on an outer portion of (e.g., at a periphery of) the display area DA. A display unit is on the display area DA, and a power line, etc. may be on the non-display area. In addition, a pad portion C may be on the non-display area.

The display apparatus 20 may include the display panel D and the film member F. The display panel D may include the substrate 21, the display unit, and a thin film encapsulation layer E.

Various layers may be on the substrate 21. The substrate 21 may include a plastic material, such as polyethylene phthalate (PET), and/or a metallic material, such as stainless steel (SUS) or titanium (Ti). In addition, the substrate 21 may include polyimide (PI). However, the substrate 21 is not limited thereto and may include other suitable layers. Hereinafter, for convenience of explanation, an embodiment in which the substrate 21 includes polyimide will be described in detail.

The display unit may be formed on the substrate 21. In this respect, the display unit includes a thin film transistor TFT, a passivation layer 27 covering the thin film transistor TFT, and an organic light-emitting diode (OLED) 28 on the passivation layer 27.

A buffer layer 22 including an organic compound and/or an inorganic compound is further formed on the substrate 21. The buffer layer 22 may include silicon oxide ($SiO_x$ ($x \geq 1$)) or silicon nitride ($SiN_x$ ($x \geq 1$)).

An active layer 23 is formed on the buffer layer 22 in a pattern, and then, the active layer 23 is buried (or covered) by a gate insulating layer 24. The active layer 23 includes, a source region 23a, a drain region 23b, and a channel region 23c between the source and drain regions 23a and 23b.

The active layer 23 may include various suitable materials. For example, the active layer 23 may include an inorganic semiconductor material, such as amorphous silicon or crystalline silicon. As another example, the active layer 23 may include an oxide semiconductor. As yet another example, the active layer 23 may include an organic semiconductor material. Hereinafter, for convenience of explanation, an embodiment in which the active layer 23 includes amorphous silicon will be described below in detail.

The active layer 23 may be obtained by forming an amorphous silicon layer on the buffer layer 22, crystallizing the amorphous silicon layer to be a polycrystalline silicon layer, and patterning the polycrystalline silicon layer. The source region 23a and the drain region 23b of the active layer 23 are doped with impurities, according to a type of the thin film transistor (TFT) (e.g., a driving TFT or a switching TFT).

A gate electrode 25 corresponding to the active layer 23 and an interlayer insulating layer 26 burying the gate electrode 25 are formed on the gate insulating layer 24.

In addition, after contact openings H1 and H2 (e.g., contact holes) are formed in the interlayer insulating layer 26 and the gate insulating layer 24, a source electrode 27a and a drain electrode 27b are formed on the interlayer insulating layer 26 to respectively contact the source region 23a and the drain region 23b.

The passivation layer 27 is formed on the thin film transistor TFT, and a pixel electrode 28a of the OLED 28 is formed on the passivation layer 27. The pixel electrode 28a contacts the drain electrode 27b of the thin film transistor TFT through a via opening H3 (e.g., a via hole) formed in the passivation layer 27. The passivation layer 27 may have a single-layer structure or multi-layer structure including an inorganic material and/or an organic material. The passivation layer 27 may be formed as a planarization layer to provide a flat upper surface, regardless of uneven lower layers but, in other embodiments, may be formed according to shapes of the lower layers. In addition, the passivation layer 27 may include a transparent insulating material in order to provide a resonant effect.

After the pixel electrode 28a is formed on the passivation layer 27, a pixel-defining layer 29 including an organic material and/or an inorganic material is formed to cover the pixel electrode 28a and the passivation layer 27, and the pixel-defining layer 29 has an opening to expose the pixel electrode 28a.

In addition, an intermediate layer 28b and an opposite electrode 28c are formed at least on the pixel electrode 28a.

The pixel electrode 28a functions as an anode electrode and the opposite electrode 28c functions as a cathode electrode, or vice versa.

The pixel electrode 28a and the opposite electrode 28c are insulated from each other via the intermediate layer 28b and apply voltages having different polarities to the intermediate layer 28b so that an organic emission layer emits light.

The intermediate layer 28b may include the organic emission layer. As another example, the intermediate layer 28b includes the organic emission layer and may further include a hole injection layer (HIL), a hole transport layer (HTL), an electron transport layer (ETL), and/or an electron injection layer (EIL). However, the present invention is not limited thereto, and the intermediate layer 28b may include an organic emission layer and may further include other various suitable functional layers.

A unit pixel includes sub-pixels that may emit lights of various colors. For example, the unit pixel may include sub-pixels that emit red, green, and blue light or sub-pixels that emit red, green, blue, and white light.

The thin film encapsulation layer E may include inorganic layers or an inorganic layer and an organic layer.

The organic layer of the thin film encapsulation layer E may include a polymer and may be a single layer or a layer stack including polyethylene terephthalate, polyimide (PI), polycarbonate, epoxy, polyethylene, and/or polyacrylate.

The organic layer may include polyacrylate, and in some embodiments, may include a polymerized monomer composition including a diacrylate-based monomer and a triacrylate-based monomer. The monomer composition may further include a monoacrylate-based monomer. Also, the monomer composition may further include a well-known photoinitiator, such as trimethylbenzoyl diphenylphosphine oxide (TPO). However, the present invention is not limited thereto.

The inorganic layer of the thin film encapsulation layer E may be a single layer or a layer stack including a metal oxide and/or a metal nitride. For example, the inorganic layer may include silicon nitride ($SiN_x$), aluminum oxide ($Al_2O_3$), silicon oxide ($SiO_2$), and/or titanium oxide ($TiO_2$).

An uppermost layer of the thin film encapsulation layer E that is exposed to the outside may include an inorganic layer in order to prevent intrusion of moisture into the OLED 28.

The thin film encapsulation layer E may include a sandwich structure in which an organic layer is between a plurality inorganic layers. In another embodiment, the thin film encapsulation layer E may include a sandwich structure in which an inorganic layer is between a plurality of organic layers. In another embodiment, the thin film encapsulation layer E may include a sandwich structure in which an organic layer is between a plurality of inorganic layers and a sandwich structure in which an inorganic layer is between a plurality of organic layers.

The thin film encapsulation layer E may include a first inorganic layer, a first organic layer, and a second inorganic layer sequentially from a top portion of the OLED 28.

In another embodiment, the thin film encapsulation layer E may include a first inorganic layer, a first organic layer, a second inorganic layer, a second organic layer, and a third inorganic layer sequentially from the top portion of the OLED 28.

In another embodiment, the thin film encapsulation layer E may include a first inorganic layer, a first organic layer, a second inorganic layer, a second organic layer, a third inorganic layer, a third organic layer, and a fourth inorganic layer sequentially from the top portion of the OLED 28.

A halogenated metal layer including, for example, lithium fluoride (LiF), may be further included between the OLED 28 and the first inorganic layer. The halogenated metal layer may prevent the OLED 28 from being damaged when the first inorganic layer is formed by a sputtering method.

An area of the first organic layer may be smaller than that of the second inorganic layer, and an area of the second organic layer may be smaller than that of the third inorganic layer.

In addition, the display panel D may also include a touch layer in which a signal is generated according to contact by a user. In such an embodiment, the touch layer may be on the thin film encapsulation layer E. However, for convenience of explanation, the display panel D in the illustrated embodiment omits the touch layer.

The film member F may have various suitable forms. For example, the film member F may include a polarization film, a touch screen panel, and/or various suitable functional films. The functional film may be a film member having a certain function, for example, a scratch-resistant film member, a corrosion-resistant film member, a reinforcing film member, etc.

The film member F may be flexible. In such embodiments, a separate adhesive member O may be between the film member F and the display panel D. The adhesive member O may a liquid type, a gel type, or a film type.

In an apparatus and method of manufacturing a display apparatus according to embodiments, a film member may be accurately attached to a display panel. In addition, a failure rate during the manufacture of a display apparatus may be decreased.

In an apparatus and method of manufacturing a display apparatus according to embodiments, a display apparatus may be simply manufactured.

It should be understood that the exemplary embodiments described herein should be considered in a descriptive sense only and not for purposes of limitation. Descriptions of features or aspects within each embodiment should typically be considered as available for other similar features or aspects in other embodiments.

While embodiments have been described with reference to the figures, it will be understood by those of ordinary skill in the art that various changes in form and details may be made therein without departing from the spirit and scope of the present invention as defined by the following claims and their equivalents.

What is claimed is:

1. A method of manufacturing a display apparatus, the method comprising:
   arranging a film member on a first stage and arranging a display panel on a second stage, the first stage being spaced from and at the same level as the second stage;
   linearly moving the first stage to correspond to a drum such that the film member moves from the first stage to the drum while the first stage linearly moves and the drum rotates; and
   linearly moving the second stage to correspond to the film member on the drum such that the film member moves from the drum to the display panel while the second stage linearly moves and the drum rotates.

2. The method of claim 1, further comprising detecting a location of the film member on the first stage by using a vision portion.

3. The method of claim 2, further comprising comparing a reference location with the detected location of the film member and adjusting the location of the film member to correspond to the reference location.

4. The method of claim 1, further comprising detecting a location of the display panel on the second stage by using a vision portion.

5. The method of claim 4, further comprising comparing a reference location with the detected location of the display panel and adjusting the location of the display panel to correspond to the reference location.

6. The method of claim 1, wherein, when the film member is attached to the drum, a movement velocity of the first stage is synchronized with a rotation velocity of the drum.

7. The method of claim 1, wherein, when the film member is attached to the display panel, a movement velocity of the second stage is synchronized with a rotation velocity of the drum.

8. The method of claim 1, further comprising removing a protection member from the film member.

9. The method of claim 1, wherein the first stage linearly moves in a first direction to transfer the film member from the first stage to the drum, and
   wherein the second stage linearly moves in the first direction to transfer the film member from the drum to the display panel.

10. An apparatus for manufacturing a display apparatus, the apparatus comprising:
    a support;
    a first stage on the support and configured to be linearly movable and to receive a film member thereon;
    a second stage on the support and spaced from the first stage, the second stage being configured to be linearly movable and to receive a display panel thereon; and a drum spaced from the first stage and the second stage and configured to selectively receive the film member and to transfer the film member to the display panel, wherein the first stage is spaced from and at the same level as the second stage.

* * * * *